(12) United States Patent
He et al.

(10) Patent No.: US 9,484,871 B1
(45) Date of Patent: Nov. 1, 2016

(54) COMPLEX BANDPASS FILTER HAVING A TRANSFER FUNCTION WITH TWO POLES

(71) Applicant: Marvell International Ltd., Hamilton (BM)

(72) Inventors: Shan He, Fremont, CA (US); Randy Tsang, San Carlos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/710,092

(22) Filed: May 12, 2015

Related U.S. Application Data (60) Provisional application No. 61/994,527, filed on May 16, 2014.

(51) Int. Cl.
    *H03K 5/00*     (2006.01)
    *H03F 3/45*     (2006.01)
    *H03H 11/04*     (2006.01)

(52) U.S. Cl.
CPC ..... *H03F 3/45071* (2013.01); *H03F 2200/429* (2013.01); *H03F 2203/45084* (2013.01); *H03H 2011/0494* (2013.01)

(58) Field of Classification Search
CPC ......... H03H 11/0422; H03H 11/0494; H03H 7/0171; H03H 11/04; H03H 11/365
USPC .................................. 327/551–559
See application file for complete search history.

(56) References Cited

U.S. PATENT DOCUMENTS

| | | | | |
|---|---|---|---|---|
| 6,970,515 B1* | 11/2005 | Bicakci | ............... | H04L 25/0278 370/321 |
| 7,389,087 B2* | 6/2008 | Darabi | ................... | H03B 21/01 323/237 |
| 8,019,290 B2* | 9/2011 | Mak | ....................... | H03D 3/007 375/295 |
| 2010/0207691 A1* | 8/2010 | Kim | .................... | H03F 3/45475 330/69 |

FOREIGN PATENT DOCUMENTS

JP        2014060620     *   9/2012

* cited by examiner

*Primary Examiner* — Dinh T Le (57) ABSTRACT

In some implementations, a filter circuit includes a first signal path that includes a first amplifier and a second signal path that includes a second amplifier. The first signal path is configured to receive a first component of a complex signal and provide a filtered version of the first component of the complex signal. The second signal path is configured to receive a second component of the complex signal and provide a filtered version of the second component of the complex signal. The first signal path before the first amplifier is coupled to the second signal path before the second amplifier. The first signal path after the first amplifier is coupled to the second signal path before the second amplifier. The second signal path after the second amplifier is coupled to the first signal path before the first amplifier.

20 Claims, 5 Drawing Sheets

COMPLEX BANDPASS FILTER HAVING A TRANSFER FUNCTION WITH TWO POLES

CROSS REFERENCE TO RELATED APPLICATIONS

This disclosure claims the benefit of priority under 35 U.S.C. §119(e) of U.S. Provisional Application No. 61/994,527 filed on May 16, 2014, titled "Complex Rauch Filter Design," the disclosure of which is hereby incorporated by reference in its entirety.

BACKGROUND

The present disclosure relates to signal processing filters.

A signal processing filter is a circuit that can be used to remove or attenuate undesired frequency components from an analog signal, to enhance desired frequency components, or both. A filter's frequency response, e.g., high-pass, low-pass, bandpass, notch, or all-pass, is defined primarily by its transfer function. The transfer function H(s) of a filter is the ratio of the output signal $V_{OUT}$ to the input signal $V_{IN}$ as a function of the complex frequency s as given by the equation $$H(s) = \frac{V_{OUT}(s)}{V_{IN}(s)}$$

where $s=\sigma+j\omega$. The number of poles in the transfer function can determine the order of the filter. A high order filter will have a frequency response with a steeper slope than a low order filter. To achieve the desired attenuation of undesired frequency components that are close to a desired frequency component, a high order filter may be needed.

Figure 1:
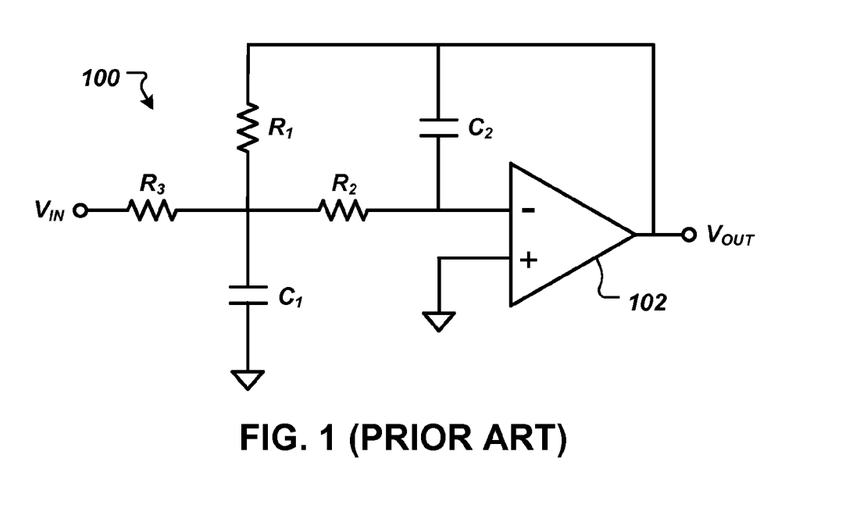
FIG. 1 is a schematic diagram showing a conventional Rauch filter.

A multiple feedback filter, also known as a Rauch filter, can be used to implement a second order low-pass filter. FIG. 1 shows a conventional Rauch filter 100. The Rauch filter 100 receives a single input signal $V_{IN}$ and provides a single output signal $V_{OUT}$ using an operational amplifier or operational transconductance amplifier 102. The transfer function of the Rauch filter 100 is given by the following equation:

$$H(s) = \frac{(G_2 G_3)/(C_1 C_2)}{s^2 + s(G_1 + G_2 + G_3)/C_1 + (G_1 G_2)/(C_1 C_2)}$$

where $G_1=1/R_1$, $G_2=1/R_2$, and $G_3=1/R_3$. The transfer function of the Rauch filter 100 has two poles and real coefficients in the transfer function. The Rauch filter 100 can be included in, for example, a global positioning system (GPS) receiver for processing GPS signals.

Figure 2:
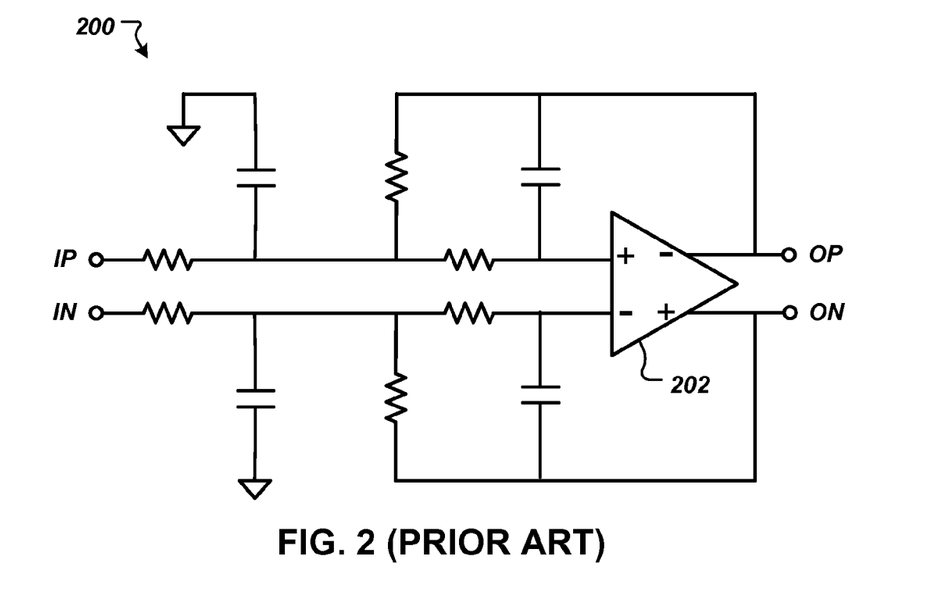
FIG. 2 is a schematic diagram showing a fully differential Rauch filter.

FIG. 2 shows a fully differential Rauch filter 200 that receives a differential input signal including signals IP and IN and provides a differential output signal including signals OP and ON using a fully differential operational amplifier or operational transconductance amplifier 202. The differential output signal of the Rauch filter 200 is controlled by two feedback paths. The transfer function of the Rauch filter 200 has two poles and real coefficients in the transfer function.

In applications such as low radio frequency (RF) communication receivers with low-IF (intermediate frequency) downconversion, a complex bandpass filter with an asymmetric frequency response with respect to frequency f=0 may be used to separate the desired radio frequency signal from all other signals picked up by an antenna. A complex filter can be used to implement a bandpass filter that has an asymmetric frequency response. A complex filter has a transfer function with complex coefficients which correspond to the asymmetric frequency response.

Figure 3:
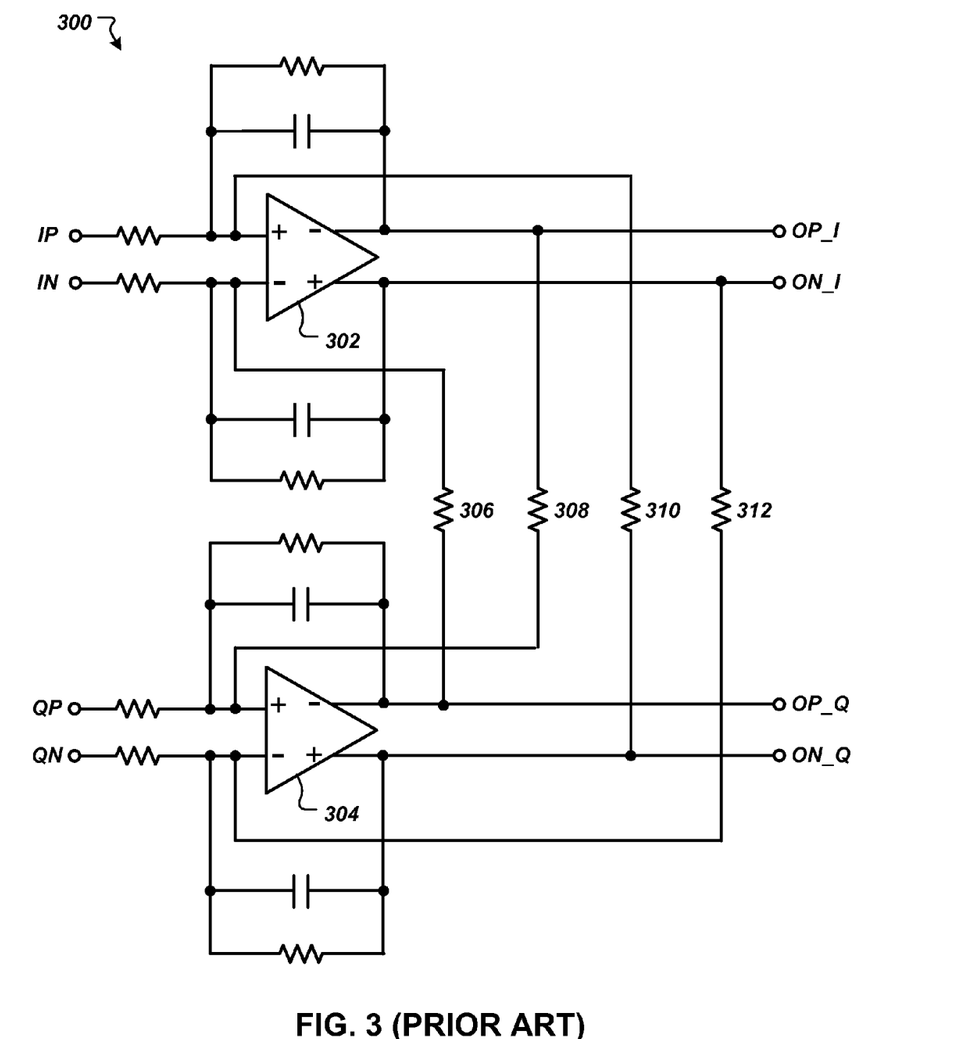
FIG. 3 is a schematic diagram showing an active RC filter.

An example of a complex bandpass filter includes an active RC filter 300 as shown in FIG. 3. The active RC filter 300 includes a pair of amplifiers, for example, operational amplifiers or operational transconductance amplifiers 302 and 304. The amplifier 302 processes a complex signal that includes pairs of real signals. The first pair of real signals, which is the real component of the complex signal, includes signals received at inputs IP and IN. The second pair of real signals, which is the imaginary component of the complex signal, includes signals received at inputs QP and QN. The cross-coupling of the real and imaginary signal paths using resistors 306, 308, 310, and 312 results in the transfer function having complex coefficients.

The active RC filter 300 is a first order complex bandpass filter that has a transfer function with one pole. If an undesired signal has a frequency near the frequency of the desired signal, a first order bandpass filter may not provide sufficient attenuation of the undesired signal. A second order complex bandpass filter can be implemented using two pairs of amplifiers by, for example, cascading two stages of the active RC filter 300. Because such a filter includes four amplifiers, the filter may increase the size and power consumed by a system, such as a low-IF RF signal receiver, that includes the filter.

SUMMARY

The present disclosure describes systems and techniques relating to a complex filter. In general, in one aspect, a circuit includes a first signal path that includes a first amplifier and a second signal path that includes a second amplifier. The first signal path is configured to receive a first component of a complex signal and provide a filtered version of the first component of the complex signal. The second signal path is configured to receive a second component of the complex signal and provide a filtered version of the second component of the complex signal. The first signal path before the first amplifier is coupled to the second signal path before the second amplifier. The first signal path after the first amplifier is coupled to the second signal path before the second amplifier. The second signal path after the second amplifier is coupled to the first signal path before the first amplifier.

In another aspect, a system includes a first Rauch filter circuit that includes a first amplifier and a second Rauch filter that includes a second amplifier. The first Rauch filter circuit is configured to receive a first component of a complex signal and provide a filtered version of the first component of the complex signal. The second Rauch filter circuit configured to receive a second component of the complex signal and provide a filtered version of the second component of the complex signal. The portion of the first Rauch filter circuit before the first amplifier is coupled to a portion of the second Rauch filter circuit before the second amplifier. An output of the first Rauch filter circuit is coupled to the portion of the second Rauch filter circuit before the second amplifier. An output of the second Rauch filter circuit is coupled to the portion of the first Rauch filter circuit before the first amplifier.

In yet another aspect, a method includes receiving, by a first signal path that includes a first amplifier, a first component of a complex signal; receiving, by a second signal path that includes a second amplifier, a second component of the complex signal; providing cross-coupling of a portion of the first signal path before the first amplifier to a portion of the second signal path before the second amplifier; providing, by the first signal path after the first amplifier, a filtered version of the first component of the complex signal to the second signal path before the second amplifier; and providing, by the second signal path after the second amplifier, a filtered version of the second component of the complex signal to the first signal path before the first amplifier.

The described systems and techniques can be implemented so as to realize one or more of the following advantages. The circuit can be used to provide a second order complex bandpass filter with an asymmetric frequency response. In contrast to a second order complex bandpass filter that includes two pairs of amplifiers, the circuit includes a single pair of amplifiers which may reduce the size and power consumption of a signal processing system.

Details of one or more implementations are set forth in the accompanying drawings and the description below. Other features, objects, and advantages may be apparent from the description, the drawings, and the claims.

DETAILED DESCRIPTION

Figure 4:
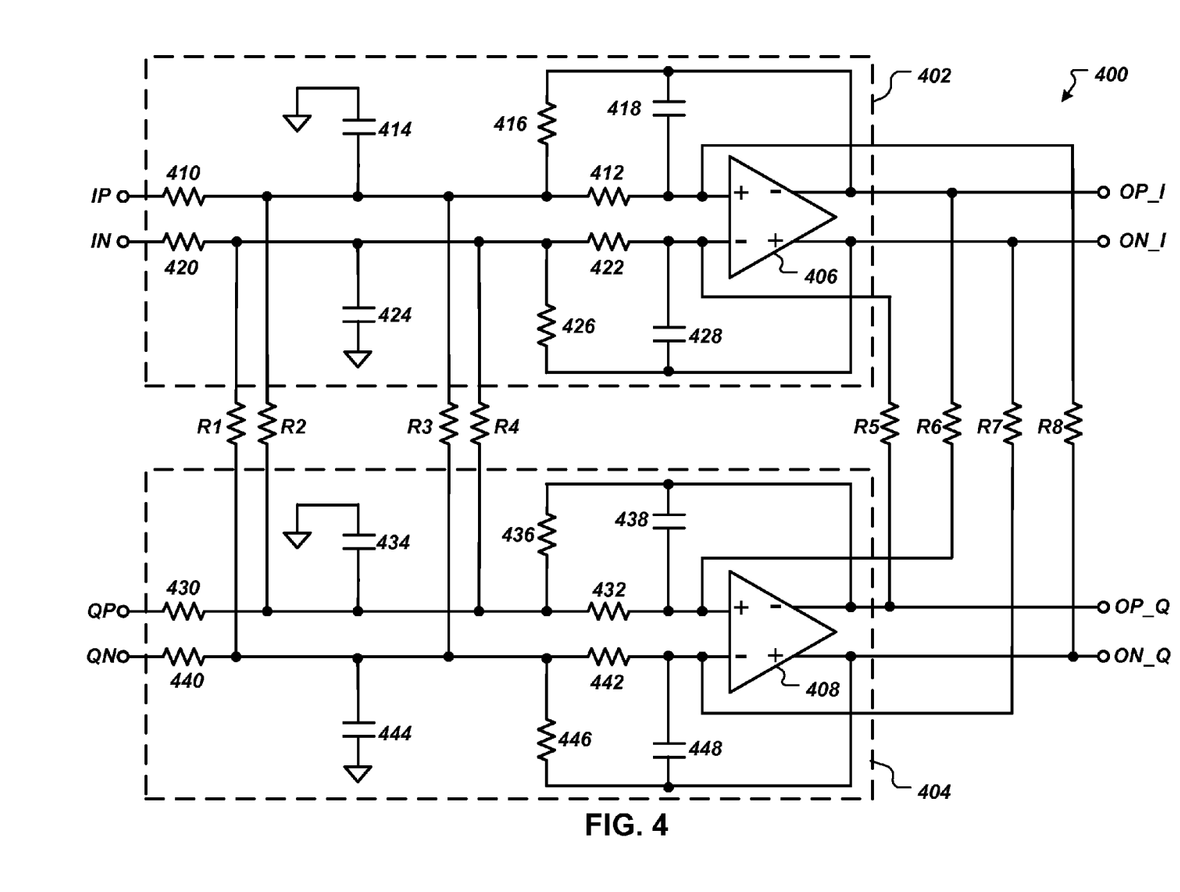
FIG. 4 is a schematic diagram showing an example of a complex bandpass filter.

FIG. 4 is a schematic diagram showing an example of a complex bandpass filter 400. The filter 400 can be used to filter a complex analog signal that includes a real component and an imaginary component. The real component and the imaginary component may be differential signals. The filter 400 includes a real signal path that receives the real component at inputs IP and IN and provides a filtered version of the real component at outputs OP_I and ON_I. The filter 400 includes an imaginary signal path that receives the imaginary component at inputs QP and QN and provides a filtered version of the imaginary component at outputs OP_Q and ON_Q. The filtered real component and the filtered imaginary component may be differential signals.

The real signal path includes a Rauch filter 402 between the inputs IP, IN and the outputs OP_I, ON_I. The Rauch filter 402 includes passive elements and an amplifier 406 that are arranged in accordance with a multiple feedback topology. Other suitable topologies may be possible. The amplifier 406 can be a fully differential operational amplifier or operational transconductance amplifier.

The Rauch filter 402 includes a resistor 410 and a resistor 412 connected in series between the input IP and a positive terminal of the amplifier 406. The Rauch filter 402 includes a capacitor branch, which includes a capacitor 414, connected between the resistor 410 and the resistor 412. A signal provided by a negative output terminal of the amplifier 406 is fed back to the positive input terminal of the amplifier 406 through a feedback path that includes a resistor 416 and a capacitor 418 connected in parallel. A branch of the feedback path that includes the resistor 416 is connected between the resistor 410 and the resistor 412. A branch of the feedback path that includes the capacitor 418 is connected between the resistor 412 and the positive input terminal of the amplifier 406. The signal at the negative output terminal of the amplifier 406 is provided to the output OP_I.

The Rauch filter 402 includes a resistor 420 and a resistor 422 connected in series between the input IN and a negative input terminal of the amplifier 406. The Rauch filter 402 includes a capacitor branch, which includes a capacitor 424, connected between the resistor 420 and the resistor 422. A signal provided by a positive output terminal of the amplifier 406 is fed back to the negative input terminal of the amplifier 406 through a feedback path that includes a resistor 426 and a capacitor 428 connected in parallel. A branch of the feedback path that includes the resistor 426 is connected between the resistor 420 and the resistor 422. A branch of the feedback path that includes the capacitor 428 is connected between the resistor 422 and the negative input terminal of the amplifier 406. The signal at the negative output terminal of the amplifier 406 is provided to the output ON_I.

The imaginary signal path includes a Rauch filter 404 between the inputs QP, QN and the outputs OP_Q, ON_Q. The Rauch filter 404 includes passive elements and an amplifier 408 that are arranged in accordance with the multiple feedback topology. The amplifier 408 can be a fully differential operational amplifier or operational transconductance amplifier.

The Rauch filter 404 includes a resistor 430 and a resistor 432 connected in series between the input QP and a positive terminal of the amplifier 408. The Rauch filter 404 includes a capacitor branch, which includes a capacitor 434, connected between the resistor 430 and the resistor 432. A signal provided by a negative output terminal of the amplifier 408 is fed back to the positive input terminal of the amplifier 408 through a feedback path that includes a resistor 436 and a capacitor 438 connected in parallel. A branch of the feedback path that includes the resistor 436 is connected between the resistor 430 and the resistor 432. A branch of the feedback path that includes the capacitor 438 is connected between the resistor 432 and the positive input terminal of the amplifier 408. The signal at the negative output terminal of the amplifier 408 is provided to the output OP_Q.

The Rauch filter 404 includes a resistor 440 and a resistor 442 connected in series between the input QN and a negative input terminal of the amplifier 408. The Rauch filter 404 includes a capacitor branch, which includes a capacitor 444, connected between the resistor 440 and the resistor 442. A signal provided by a positive output terminal of the amplifier 408 is fed back to the negative input terminal of the amplifier 408 through a feedback path that includes a resistor 446 and a capacitor 448 connected in parallel. A branch of the feedback path that includes the resistor 446 is connected between the resistor 440 and the resistor 442. A branch of the feedback path that includes the capacitor 448 is connected between the resistor 442 and the negative input terminal of the amplifier 408. The signal at the negative output terminal of the amplifier 408 is provided to the output ON_Q.

The Rauch filter 402 in the real signal path and the Rauch filter 404 in the imaginary signal path are cross coupled using resistors R1-R8. Each of the Rauch filters 402 and 404 has a transfer function with two poles and real coefficients. The cross-coupling of real signal path of the Rauch filter 402 and the imaginary signal path of the Rauch filter 404 results in the filter 400 having a transfer function with two poles and real coefficients. The cross-coupling of the real signal path and the imaginary signal path enables the real signal path to reject the undesired signal based on the phase shift of the real component and the phase shift of the imaginary component. Similarly, the cross-coupling of the real signal path and the imaginary signal path enables the imaginary signal path to reject the undesired signal based on the phase shift of the real component and the phase shift of the imaginary component. The cross-coupling of the real signal path and the imaginary signal path adds complex coefficients into the transfer function of the filter 400, thereby providing the filter 400 with an asymmetric frequency response with respect to frequency f=0.

The resistors R1-R4 couple a portion of the real signal path before the amplifier 406 to a portion of the imaginary signal path before the amplifier 408. The resistor R1 couples the real signal path between the resistor 420 and capacitor branch including capacitor 424 to the imaginary signal path between the resistor 440 and the capacitor branch including capacitor 444. The resistor R2 couples the real signal path between the resistor 410 and the capacitor branch including capacitor 414 to the imaginary signal path between the resistor 430 and the capacitor branch including capacitor 434. The resistor R3 couples the real signal path between the capacitor branch including capacitor 414 and the resistor branch including resistor 416 to the imaginary signal path between the capacitor branch including capacitor 444 and the resistor branch including resistor 446. The resistor R4 couples the real signal path between the capacitor branch including capacitor 424 and the resistor branch including resistor 426 to the imaginary signal path between the capacitor branch including capacitor 434 and the resistor branch including resistor 436.

The resistors R6 and R7 couple a portion of the real signal path after the amplifier 406 to a portion of the imaginary signal path before the amplifier 408. The resistor R6 couples the negative output terminal of the amplifier 406 to the positive input terminal of the amplifier 408, thereby providing a first portion of the filtered real component to the positive input terminal of the amplifier 408 in the imaginary signal path. The resistor R7 couples the positive output terminal of the amplifier 406 to the negative input terminal of the amplifier 408, thereby providing a second portion of the filtered real component to the negative input terminal of the amplifier 408 in the imaginary signal path.

The resistors R5 and R8 couple a portion of the imaginary signal path after the amplifier 408 to a portion of the real signal path before the amplifier 406. The resistor R5 couples the negative output terminal of the amplifier 408 to the negative input terminal of the amplifier 406, thereby providing a first portion of the filtered imaginary component to the negative input terminal of the amplifier 406 in the real signal path. The resistor R8 couples the positive output terminal of the amplifier 408 to the positive input terminal of the amplifier 406, thereby providing a second portion of the filtered imaginary component to the positive input terminal of the amplifier 406 in the real signal path.

The center radian frequency of the filter 400 is set by the inverse of the gain product of the resistance value of the resistor R1 and the capacitance value of the capacitor 414. The resistors R1, R2, R3, and R4 have the same resistance value. The resistors R5, R6, R7, and R8 have the same resistance value. The resistance value of the resistor R1 may be equal to the resistance value of the resistor R5. The capacitors 414, 424, 434, and 44 have the same capacitance value. The capacitors 418, 428, 438, and 448 have the same capacitance value. The capacitance value of capacitor 414 may be equal to the capacitance value of capacitor 418. The gain of the filter 400 is set by the resistance values of the resistors 410, 420, 430, 440, 416, 426, 436, 446, 412, 422, 432, 442, and the capacitors 414, 424, 434, 444, 418, 428, 438 and 448. The resistors 410, 420, 430, and 440 have the same resistance value. The resistors 416, 426, 436, and 446 have the same resistance value. The resistors 412, 422, 432, and 442 have the same resistance values. The capacitors 414, 424, 434, and 444 have the same capacitance values. The capacitors 418, 428, 438, and 448 have the same capacitance values.

Figure 5:
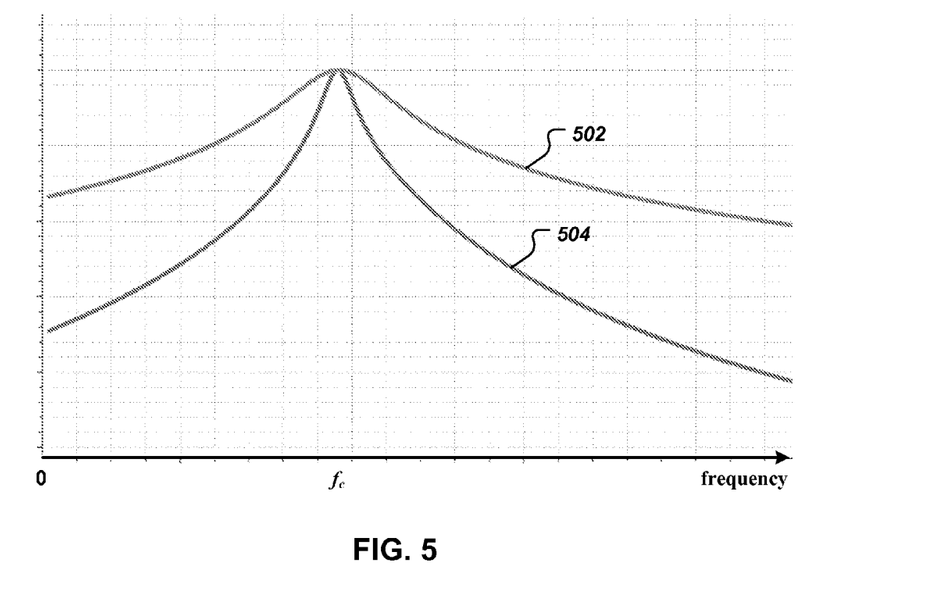
FIG. 5 is a frequency graph showing an example of a frequency response for a first order complex bandpass filter and an example of a frequency response for a second order complex bandpass filter.

FIG. 5 is a frequency graph showing an example of a frequency response 502 for a first order complex bandpass filter, e.g., the active RC filter 300 of FIG. 3, and an example of a frequency response 504 for a second order complex bandpass filter, e.g., the complex bandpass filter 400 of FIG. 4. The frequency response 502 of the first order complex bandpass filter is asymmetric with respect to frequency f=0. Similarly, the frequency response 504 of the second order complex bandpass filter is asymmetric with respect to the frequency f=0. While both frequency responses 502 and 504 are asymmetric, the frequency response 504 for the second order complex bandpass filter has a sharper roll-off or steeper slope than the frequency response 502 for the first order complex bandpass filter. Thus, the second order complex bandpass filter provides a greater amount of attenuation than the first order complex bandpass filter for frequencies near the center frequency $f_c$.

Figure 6:
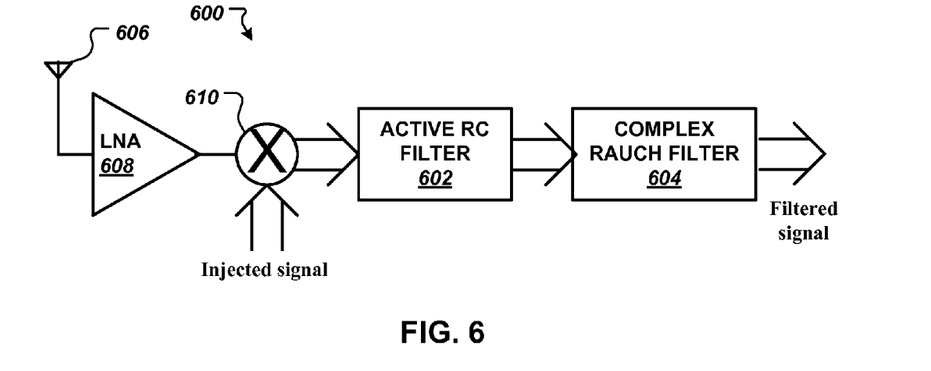
FIG. 6 is a block diagram of an example of a system that includes a complex active RC filter followed by a complex Rauch filter.

FIG. 6 is a block diagram of an example of a system 600, e.g., a portion of an analog front-end of a radio signal receiver, that includes a complex active RC filter 602, e.g., the complex active RC filter 300 of FIG. 3, followed by a complex Rauch filter 604, e.g., the complex bandpass filter 400 of FIG. 4. The system 600 receives a radio signal as an input signal and provides a filtered version of the radio signal as an output signal. The system 600 includes an antenna 606 that receives the radio signal. The radio signal is processed by a low noise amplifier (LNA) 608 and mixed with an injected signal at mixer 610. The complex differential signal from the mixer 610 is filtered by the complex active RC filter 602 and the complex Rauch filter 604. The complex active RC filter 602 may be a first order bandpass filter, and the complex Rauch filter 604 may be a second order bandpass filter. The cascading of the complex active RC filter 602 and the complex Rauch filter 604 may result in a third order bandpass filter that uses a total of four operational amplifiers. The complex Rauch filter 604 provides the filtered radio signal as the output signal to, for example, an analog-to-digital converter of a digital back-end of the radio signal receiver. Other configurations of the components of FIG. 6 may be possible.

Figure 7:
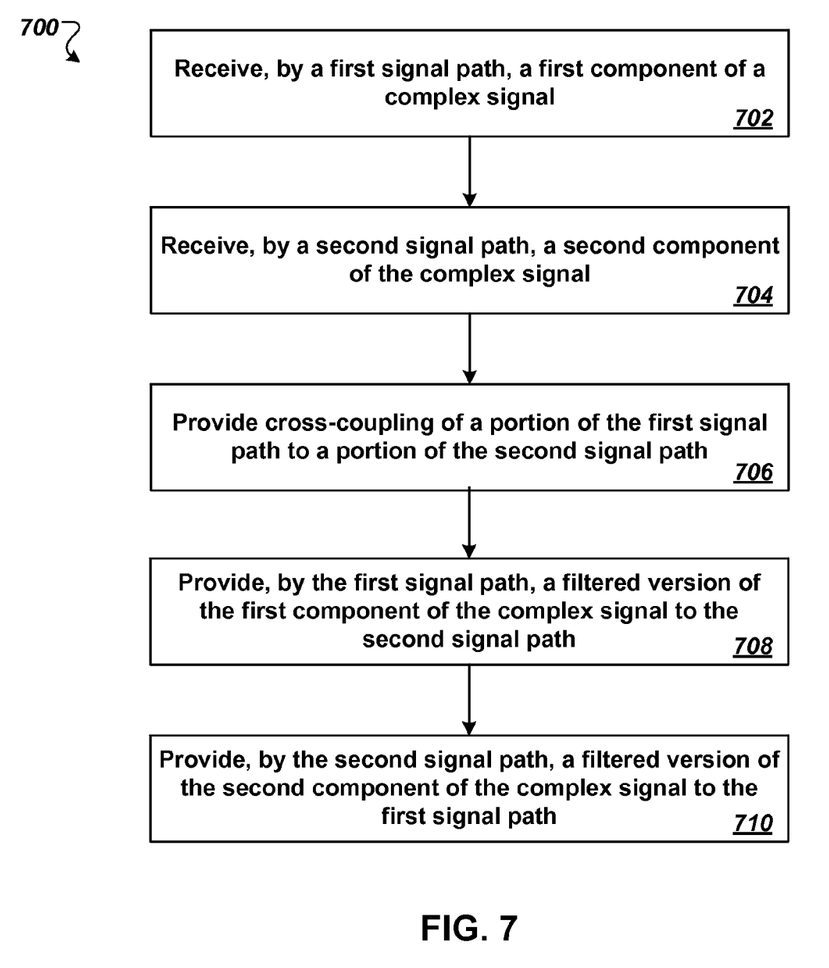
FIG. 7 is a flowchart showing examples of operations performed by a complex bandpass filter.

FIG. 7 is a flowchart showing examples of operations 700 performed by a complex bandpass filter, such as the complex bandpass filter 400 of FIG. 4. At 702, a first signal path receives a first component, e.g., the real component, of a complex signal. The first signal path may be a real signal path that processes the real component of the complex signal and include components, such as an amplifier 406, as described above in reference to FIG. 4.

At 704, a second signal path receives a second component, e.g., the imaginary component, of the complex signal. The second signal path may be an imaginary signal path that processes the imaginary component of the complex signal and include components, such as an amplifier 408, as described above in reference to FIG. 4.

At 706, the complex bandpass filter provides a cross-coupling of a portion of the first signal path before the amplifier 406 to a portion of the second signal path before the amplifier 408 in the second signal path. The cross-coupling can be provided by the complex bandpass filter as described above in reference to FIG. 4.

At 708, the first signal path after the amplifier 406 provides a filtered version of the first component of the complex signal to the second signal path before the amplifier 408. The first signal path can provide the filtered version of the first component of the complex signal to the second signal path as described above in reference to FIG. 4.

At 710, the second signal path after the amplifier 408 provides a filtered version of the second component of the complex signal to the first signal path before the amplifier 406. The second signal path can provide the filtered version of the second component of the complex signal to the first signal path as described above in reference to FIG. 4.

A few implementations have been described in detail above, and various modifications are possible. The circuits described above may be implemented in electronic circuitry, such as the structural means disclosed in this specification and structural equivalents thereof. While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Other implementations fall within the scope of the following claims.

What is claimed is:

1. A circuit comprising:
a first signal path that includes a first amplifier, the first signal path configured to receive a first component of a complex signal and provide a filtered version of the first component of the complex signal; and
a second signal path that includes a second amplifier, the second signal path configured to receive a second component of the complex signal and provide a filtered version of the second component of the complex signal,
wherein the first signal path comprises a first capacitor branch coupled to the first amplifier,
wherein the second signal path comprises a second capacitor branch coupled to the second amplifier,
wherein the first signal path before the first capacitor branch is coupled to the second signal path before the second capacitor branch,
wherein the first signal path after the first capacitor branch and before the first amplifier is coupled to the second signal path after the second capacitor branch and before the second amplifier, and
wherein the first signal path after the first amplifier is coupled to the second signal path after the second capacitor branch and before the second amplifier, and the second signal path after the second amplifier is coupled to the first signal path after the first capacitor branch and before the first amplifier.

2. The circuit of claim 1, wherein the first signal path includes a first resistor and a second resistor coupled in series before the first amplifier, the second signal path includes a third resistor and a fourth resistor coupled in series before the second amplifier, and the first signal path between the first resistor and the second resistor is coupled to the second signal path between the third resistor and the fourth resistor.

3. The circuit of claim 1, wherein the first signal path after the first amplifier is coupled to the second signal path before the second amplifier through a first resistor, and the second signal path after the second amplifier is coupled to the first signal path before the first amplifier through a second resistor.

4. The circuit of claim 1, wherein:
the first amplifier is a fully differential amplifier having a positive input terminal, a negative input terminal, a positive output terminal, and a negative output terminal; and
the second amplifier is a fully differential amplifier having a positive input terminal, a negative input terminal, a positive output terminal, and a negative output terminal.

5. The circuit of claim 4, wherein:
a first portion of the first signal path includes the first capacitor branch coupled to the positive input terminal of the first amplifier, and a second portion of the first signal path includes a third capacitor branch coupled to the negative input terminal of the first amplifier;
a first portion of the second signal path includes the second capacitor branch coupled to the positive input terminal of the second amplifier, and a second portion of the second signal path includes a fourth capacitor branch coupled to the negative input terminal of the second amplifier;
the first portion of the first signal path before the first capacitor branch is coupled to the first portion of the second signal path before the second capacitor branch;
the second portion of the first signal path before the third capacitor branch is coupled to the second portion of the second signal path before the fourth capacitor branch;
the first portion of the first signal path after the first capacitor branch and before the first amplifier is coupled to the second portion of the second signal path after the fourth capacitor branch and before the second amplifier; and
the second portion of the first signal path after the third capacitor branch and before the first amplifier is coupled to the first portion of the second signal path after the second capacitor branch and before the second amplifier.

6. The circuit of claim 4, wherein:
the negative output terminal of the first amplifier is configured to provide a first portion of the filtered first component to the positive input terminal of the second amplifier;
the positive output terminal of the first amplifier is configured to provide a second portion of the filtered first component to the negative input terminal of the second amplifier;
the negative output terminal of the second amplifier is configured to provide a first portion of the filtered second component to the negative input terminal of the first amplifier; and the positive output terminal of the second amplifier is configured to provide a second portion of the filtered second component to the positive input terminal of the first amplifier.

7. The circuit of claim 1, wherein the circuit is a second order bandpass filter with an asymmetric frequency response with respect to frequency f=0.

8. The circuit of claim 1, wherein:
the first signal path includes a first plurality of passive elements, and the first plurality of passive elements and the first amplifier are arranged in accordance with a multiple feedback topology; and
the second signal path includes a second plurality of passive elements, and the second plurality of passive elements and the second amplifier are arranged in accordance with the multiple feedback topology.

9. A system comprising:
a first Rauch filter circuit that includes a first amplifier, the first Rauch filter circuit configured to receive a first component of a complex signal and provide a filtered version of the first component of the complex signal; and
a second Rauch filter circuit that includes a second amplifier, the second Rauch filter circuit configured to receive a second component of the complex signal and provide a filtered version of the second component of the complex signal,
wherein the first Rauch filter circuit comprises a first capacitor branch coupled to the first amplifier,
wherein the second Rauch filter circuit comprises a second capacitor branch coupled to the second amplifier,
wherein a portion of the first Rauch filter circuit before the first capacitor branch is coupled to a portion of the second Rauch filter circuit before the second capacitor branch, and
wherein a portion of the first Rauch filter circuit after the first capacitor branch and before the first amplifier is coupled to a portion of the second Rauch filter circuit after the second capacitor branch and before the second amplifier, and
wherein an output of the first Rauch filter circuit is coupled to the portion of the second Rauch filter circuit after the second capacitor branch and before the second amplifier, and an output of the second Rauch filter circuit is coupled to the portion of the first Rauch filter circuit after the first capacitor branch and before the first amplifier.

10. The system of claim 9, wherein the first Rauch filter circuit includes a first resistor and a second resistor coupled in series before the first amplifier, the second Rauch filter circuit includes a third resistor and a fourth resistor coupled in series before the second amplifier, and a portion of the first Rauch filter circuit between the first resistor and the second resistor is coupled to a portion of the second Rauch filter circuit between the third resistor and the fourth resistor.

11. The system of claim 9, wherein the output of the first Rauch filter circuit is coupled to the portion of the second Rauch filter circuit after the second capacitor branch and before the second amplifier through a first resistor, and the output of the second Rauch filter circuit is coupled to the portion of the first Rauch filter circuit after the first capacitor branch and before the first amplifier through a second resistor.

12. The system of claim 9, wherein:
the first amplifier is a fully differential amplifier having a positive input terminal, a negative input terminal, a positive output terminal, and a negative output terminal; and
the second amplifier is a fully differential amplifier having a positive input terminal, a negative input terminal, a positive output terminal, and a negative output terminal.

13. The system of claim 12, wherein:
the first Rauch filter circuit includes the first capacitor branch coupled to the positive input terminal of the first amplifier and a third capacitor branch coupled to the negative input terminal of the first amplifier;
the second Rauch filter circuit includes the second capacitor branch coupled to the positive input terminal of the second amplifier and a fourth capacitor branch coupled to the negative input terminal of the second amplifier;
a portion of the first Rauch filter circuit before the first capacitor branch is coupled to a portion of the second Rauch filter circuit before the second capacitor branch;
a portion of the first Rauch filter circuit before the third capacitor branch is coupled to the a portion of the second Rauch filter circuit before the fourth capacitor branch;
a portion of the first Rauch filter circuit after the first capacitor branch and before the first amplifier is coupled to a portion of the second Rauch filter circuit after the fourth capacitor branch and before the second amplifier; and
a portion of the first Rauch filter circuit after the third capacitor branch and before the first amplifier is coupled to a portion of the second Rauch filter circuit after the second capacitor branch and before the second amplifier.

14. The system of claim 12, wherein:
the negative output terminal of the first amplifier is configured to provide a first portion of the filtered first component to the positive input terminal of the second amplifier;
the positive output terminal of the first amplifier is configured to provide a second portion of the filtered first component to the negative input terminal of the second amplifier;
the negative output terminal of the second amplifier is configured to provide a first portion of the filtered second component to negative input terminal of the first amplifier; and
the positive output terminal of the second amplifier is configured to provide a second portion of the filtered second component to the positive input terminal of the first amplifier.

15. The system of claim 9, wherein the system is a second order bandpass filter with an asymmetric frequency response with respect to frequency f=0.

16. A method comprising:
receiving, by a first signal path that includes a first capacitor branch and a first amplifier, a first component of a complex signal;
receiving, by a second signal path that includes a second capacitor branch and a second amplifier, a second component of the complex signal;
providing cross-coupling of a portion of the first signal path before the first amplifier to a portion of the second signal path before the second amplifier;

providing, by the first signal path after the first amplifier, a filtered version of the first component of the complex signal to the second signal path before the second amplifier; and providing, by the second signal path after the second amplifier, a filtered version of the second component of the complex signal to the first signal path before the first amplifier, wherein providing cross-coupling of the portion of the first signal path before the first amplifier to the portion of the second signal path before the second amplifier comprises:

providing cross-coupling of the first signal path before the first capacitor branch to the second signal path before the second capacitor branch, and providing cross-coupling of the first signal path after the first capacitor branch and before the first amplifier to the second signal path after the second capacitor branch and before the second amplifier.

17. The method of claim 16, wherein providing cross-coupling of the portion of the first signal path before the first amplifier to the portion of the second signal path before the second amplifier comprises:

providing cross-coupling of a portion of the first signal path between a first resistor and a second resistor coupled in series before the first amplifier to a portion of the second signal path between a third resistor and a fourth resistor coupled in series before the second amplifier.

18. The method of claim 16, wherein the filtered first component is provided by the first signal path to the second signal path through a first resistor, and the filtered second component is provided by the second signal path to the first signal path through a second resistor.

19. The method of claim 16, wherein:

a first portion of the first signal path includes the first capacitor branch coupled to a positive input terminal of the first amplifier, and a second portion of the first signal path includes a third capacitor branch coupled to a negative input terminal of the first amplifier;

a first portion of the second signal path includes the second capacitor branch coupled to a positive input terminal of the second amplifier, and a second portion of the second signal path includes a fourth capacitor branch coupled to a negative input terminal of the second amplifier; and providing cross-coupling of the portion of the first signal path before the first amplifier to the portion of the second signal path before the second amplifier comprises:

providing cross-coupling of the first portion of the first signal path before the first capacitor branch to the first portion of the second signal path before the second capacitor branch, providing cross-coupling of the second portion of the first signal path before the third capacitor branch to the second portion of the second signal path before the fourth capacitor branch, providing cross-coupling of the first portion of the first signal path after the first capacitor branch and before the first amplifier to the second portion of the second signal path after the fourth capacitor branch and before the second amplifier, and providing cross-coupling of the second portion of the first signal path after the third capacitor branch and before the first amplifier to the first portion of the second signal path after the second capacitor branch and before the second amplifier.

20. The method of claim 16, wherein:

providing, by the first signal path after the first amplifier, the filtered version of the first component of the complex signal to the second signal path before the second amplifier comprises:

providing, by a negative output terminal of the first amplifier, a first portion of the filtered first component to a positive input terminal of the second amplifier, and providing, by a positive output terminal of the first amplifier, a second portion of the filtered first component to a negative input terminal of the second amplifier; and providing, by the second signal path after the second amplifier, the filtered version of the second component of the complex signal to the first signal path before the first amplifier comprises:

providing, by the negative output terminal of the second amplifier, a first portion of the filtered second component to a negative input terminal of the first amplifier, and providing, by the positive output terminal of the second amplifier, a second portion of the filtered second component to a positive input terminal of the first amplifier.

* * * * *